United States Patent
Smith et al.

(10) Patent No.: US 10,628,284 B2
(45) Date of Patent: Apr. 21, 2020

(54) SYSTEM AND METHOD FOR BITSTREAM DECODING WITH COMPILER-GENERATED SYNTAX TREES

(71) Applicant: Tektronix, Inc., Beaverton, OR (US)

(72) Inventors: Mark Anderson Smith, Portland, OR (US); Michael Scott Silliman, Portland, OR (US); Andrew Loofburrow, Tigard, OR (US); Eric T. Anderson, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 15/948,923

(22) Filed: Apr. 9, 2018

(65) Prior Publication Data

US 2018/0307584 A1 Oct. 25, 2018

Related U.S. Application Data

(60) Provisional application No. 62/489,301, filed on Apr. 24, 2017, provisional application No. 62/489,326, filed on Apr. 24, 2017.

(51) Int. Cl.
| | |
|---|---|
| *G06F 9/44* | (2018.01) |
| *G06F 11/36* | (2006.01) |
| *G06F 8/41* | (2018.01) |
| *G06F 9/445* | (2018.01) |
| *H03M 7/04* | (2006.01) |
| *H03M 5/12* | (2006.01) |
| *H03M 7/28* | (2006.01) |
| *H04L 25/49* | (2006.01) |

(52) U.S. Cl.
CPC .......... *G06F 11/3616* (2013.01); *G06F 8/427* (2013.01); *G06F 8/44* (2013.01); *G06F 9/44521* (2013.01); *H03M 5/12* (2013.01); *H03M 7/04* (2013.01); *H03M 7/28* (2013.01); *H04L 25/4904* (2013.01)

(58) Field of Classification Search
None
See application file for complete search history.

(56) References Cited

U.S. PATENT DOCUMENTS

| 6,708,329 | B1* | 3/2004 | Whitehill | G06F 17/5022 717/135 |
| 2010/0088666 | A1* | 4/2010 | Box | G06F 8/42 717/104 |

OTHER PUBLICATIONS

European Patent Office, Extended European Search Report and Opinion for European Patent Application 18169096.7, dated Sep. 4, 2018, 14 pages, European Patent Office, Munich, Germany.

(Continued)

*Primary Examiner* — Qamrun Nahar
(74) *Attorney, Agent, or Firm* — Miller Nash Graham & Dunn; Andrew J. Harrington

(57) ABSTRACT

Disclosed herein are systems and methods for converting physical input signals into bitstreams using syntax trees regardless of the physical input signal's protocol. Using declarative language definitions within a protocol declaration, a test and measurement system can compile a syntax tree that automatically translates the input data into a proper bitstream output. The declarative language definitions within the protocol declaration allow custom or standard protocol rules to be written for multiple or arbitrary input protocols without writing unsafe functions, having to access memory, or debugging more complex language codes.

22 Claims, 7 Drawing Sheets

(56) References Cited

OTHER PUBLICATIONS

Xilinx, Manchester Encoder-Decoder for Xilinx CPLDs, Xilinx. com, Oct. 1, 2002, 6 pages. Retrieved from the Internet: https://www.xilinx.com/support/documentation/application_notes/xapp339.pdf.
Labnation, SmartScope Schematics, LabNation.com, Sep. 2, 2015, 9 pages. Retrieved from the Internet: http://wiki.lab-nation.com/images/8/88/SmartScope_Schematics_v1.1.pdf.
Xilinx, Manchester Encoder Chip, Xilinx.com, Jan. 22, 2000, 3 pages Retrieved from the Internet: http://www.codelooker.com/codec/2044manchesterverilog/me.vhd.html.
Alfred V. Aho et al., Compilers: Principles, Techniques, & Tools, 2nd Edition, 2007, Adidson Wesley, USA.
Tim Carstens, Programming with pcap, tcpdump.org, Jan. 1, 2002, 10 pages Retrieved from the Internet: https://www.tcpdump.org/pcap.html.

\* cited by examiner

SYSTEM AND METHOD FOR BITSTREAM DECODING WITH COMPILER-GENERATED SYNTAX TREES

CROSS-REFERENCES TO RELATED APPLICATIONS

The present application claims benefit of U.S. Provisional Application Ser. Nos. 62/489,301 and 62/489,326, filed Apr. 24, 2017, and entitled "Serial Bit Stream Decoding with Compiler-Generated Abstract Syntax Tree" and "Method for Interpreting Physical Layer Signaling for Bit Stream Generation Using Compiler Generated Abstract Syntax Tree Execution", respectively, which are each incorporated herein by reference as if reproduced in their entirety.

BACKGROUND

Within network communications, any data received through a physical medium must be first decoded from its line-coding in the physical layer and then further decoded based on its particular network protocol in the data link and network layers to output a properly translated bitstream for use in higher level layers, such as the transport, session, or application layers. This decoding process has thus far been implemented on test and measurement instrumentation as protocol decoders specially written for each protocol type encountered by the instrumentation.

Using conventional Turing complete languages, such as C or Python, in writing protocol decoders, however, is time-consuming and error prone. Prior attempts to address problems with regular expressions in protocol description languages have encountered difficulties. For example, some protocol specifications are too complex to express in conventional declarative languages. Additionally, the grammars of conventional declarative languages may be insufficient to describe all the necessary protocol specifications, such as initial packet framing steps. For these reasons, decoding for physical signals and bitstreams is typically limited to a family of similar network protocol suites, such as ethernet traffic. Likewise, protocol analyzers are designed and coded for a particular protocol, which limits their ability to flexibly operate across a variety of incoming signals.

DETAILED DESCRIPTION

Figure 1:
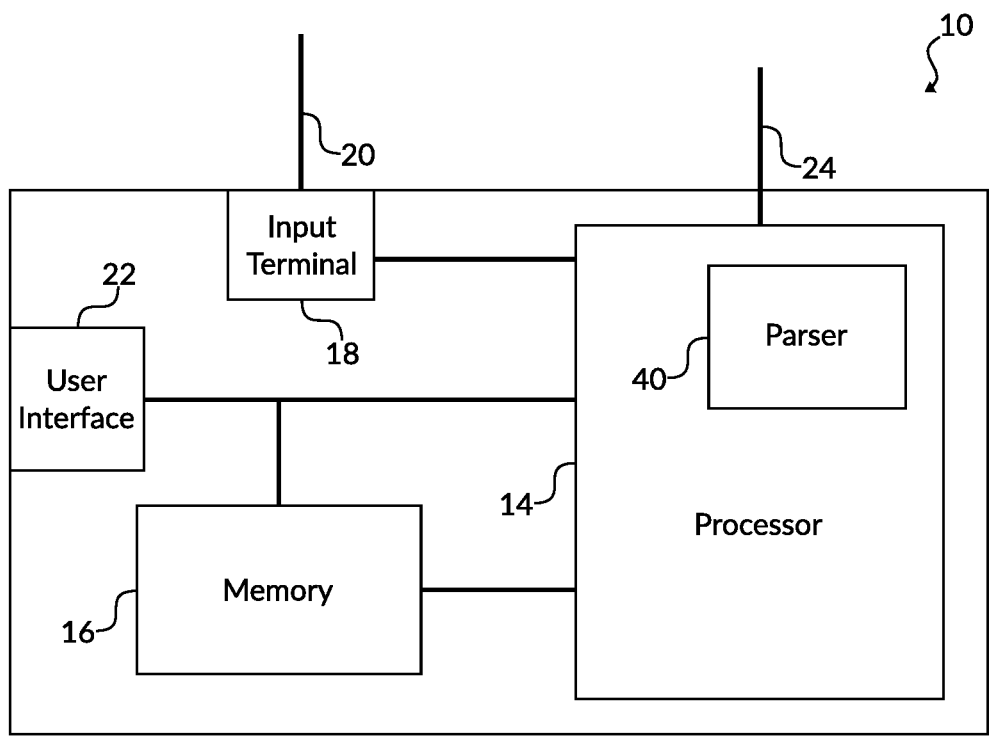
FIG. 1 is a block diagram of an example test and measurement system, according to embodiments of the invention.

The present description discloses systems and methods for decoding physical signals with arbitrary communication or network protocols using compiler-generated syntax trees, such as abstract syntax trees, for example. Within a test and measurement system, a domain-specific declarative language can textually specify the characteristics of serial, network, and/or communications protocols using declarative language definitions. When executing a protocol declaration written in the declarative language, a processor parses the protocol declaration into a syntax tree based on the textually specified bitstream, event, and field definitions. The syntax tree itself may function as a state machine to transform a physical input signal of sampled data into a protocol-specific output bitstream for use in higher level layers, such as the transport, session, or application layers. Nodes in the syntax tree may be or act as reusable state machine components so that the syntax tree can be iterated through multiple times.

Unlike in conventional systems, which require complete protocol decoder programs to be written in high-level, imperative programming languages that are prone to error and need much debugging, the declarative language of the present disclosure uses simplified elements with basic structural commonalities across many different protocols to enable defining and evaluating a protocol declaration. Where prior systems had code crashing and memory issues, the minimal declarative language set disclosed herein allows for arbitrary physical layer bitstream evaluation with both safety and efficiency, since the protocol declaration author may have no direct access to memory or memory allocation calls. Thus, the protocol declaration author may be prevented from writing unsafe custom bitstream definitions because of these constraints on the declarative language.

Based on the textually specified protocol declaration, that may include the bitstream, event, and field definitions, a parser assembles the state machine components of the syntax tree into a decoder or protocol-specific decode machine. Similar to a language interpreter, the decoder may execute by evaluating input data at each node of the syntax tree, including collecting recognized edges in the physical signal into an edge data set to translate into a raw bitstream, as discussed in more detail below. Syntax tree execution may also output a collection of framed packets with fields that describe the proper input protocol transmission. Thus, using a simple set of definitions, the declarative language may be highly flexible and used to decode a wide range of serial protocols.

The declarative language may use any or all of the following elements, for example, which will be discussed in further detail below, to textually specify a protocol declaration:

(1) bitstream definitions;
(2) event definitions;
(3) complex event definitions;
(4) event time inclusion/exclusion tokens;
(5) scoped if clauses;
(6) arbitrary bit-stuff rule definitions;

(7) scoped regions within arbitrary sections of packet definitions;
(8) field matching rules;
(9) field quantifier rules;
(10) field nesting and grouping;
(11) field properties;
(12) field action definitions;
(13) arbitrary CRC polynomial definitions; and
(14) error and CRC field sequence definitions.

Example embodiments combine several unique properties of the declarative language, using the example elements above, other potential elements, and the resulting syntax trees, to provide a degree of generalization applicable for decoding any arbitrary serial, network, or communications protocol. The definitions coded in the declarative language enable the communications hardware to translate or decode physical signals and their encoded data regardless of the particular embedded protocols, which could include standard and/or customized line code encoding (e.g., NRZ, Manchester) as well as data link protocols (e.g., Ethernet, Point-to-Point (PPP), High-Level Data Link Control (HDLC), Advanced Data Communication Control Procedures (ADCCP)), for example.

As mentioned above, the protocol declaration may include bitstream definitions, event definitions, and field definitions. The bitstream definitions define how to convert analog or physical input signals into a binary bitstream sequence of 1s and 0s. The event definitions define how to detect or create packet frame boundaries. Finally, the field definitions define how to map or match bitstream values into packets, including, for example, headers, footers, properties, characteristics, actions, flagging, error-handling, etc.

Specifically, the declarative language of the present disclosure may use limited-scope, domain-specific grammar to define the conversion of an analog physical layer signal into a bitstream sequence. The analog signal may be acquired by a test probe, for example. This converted bitstream sequence may then be used for additional protocol parsing. In this way, a protocol declaration author does not need to be a programmer, and instead may only learn a relatively small set of language elements. New bitstream definitions for converting physical input signals may be created without modifications to the underlying runtime engine, which enables these bitstream definitions and capabilities to be deployed without requiring modification to device or instrument firmware, as is necessary in conventional systems.

The declarative language supports generalized expression evaluation and variable declaration and assignment, thus allowing arbitrary mathematical and Boolean operations on inputs. Further, the expression evaluation allows data types such as Boolean, integer, floating point, and current edge value, for example.

FIG. 1 illustrates an example test and measurement system 10, including a processor 14 and memory 16 for storing declarative language definitions. The test and measurement system 10 has an input terminal 18 for receiving a physical signal over a physical medium input line 20. The physical signal may be transmitted using any known physical medium, such as electric voltage, radio frequencies, or infrared light, for example. The test and measurement system 10 may also include a user interface 22, which can be integral (as shown) or external to the system 10. A parser 40 within or coupled to the processor 14 uses the declarative language definitions, coded by the protocol declaration author and stored in memory 16, to compile a syntax tree. As would be understood by one skilled in the art, the parser 40 may include a compiler and/or a lexer, or alternatively may be a compiler and/or lexer instead of a parser. The processor 14 then executes the syntax tree on the physical input signal coming into the system 10 at the input terminal 18. Execution of the syntax tree uses the protocol declaration's definitions to translate the data at the input terminal 18 into a bitstream that can be further processed in the test and measurement system 10 or output over the output line 24.

Figure 2:
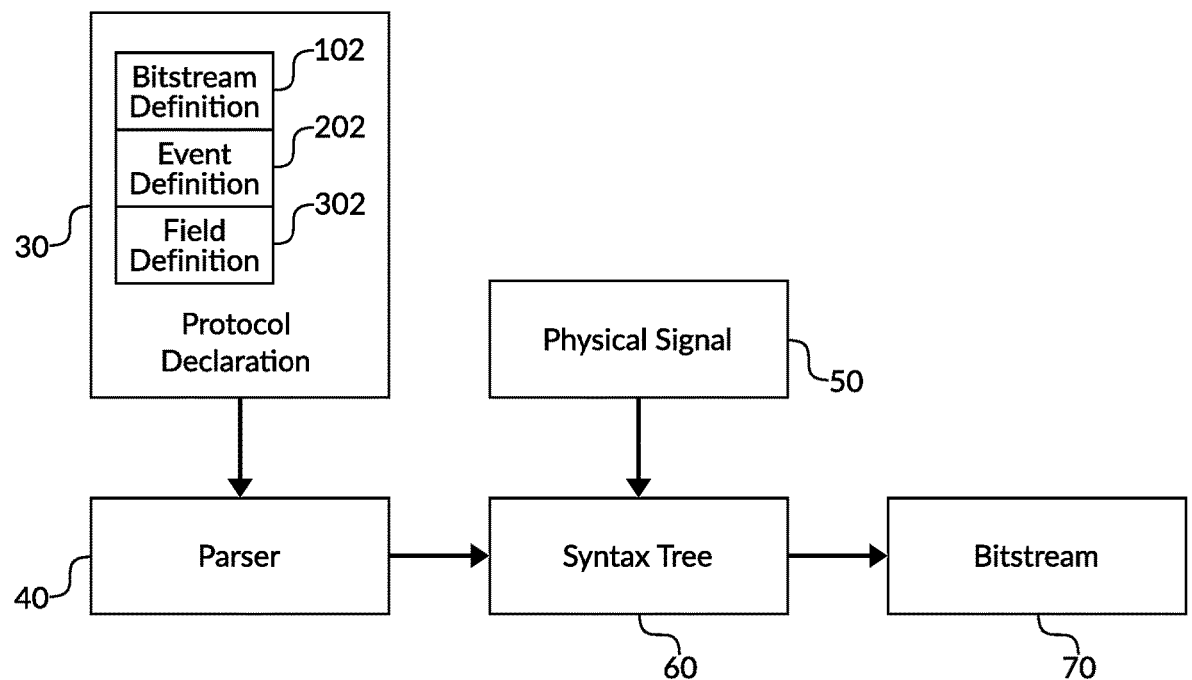
FIG. 2 is a block diagram of an example method of converting a physical input signal into a packeted bitstream using a syntax tree compiled based on a protocol declaration, according to embodiments of the invention.

FIG. 2 illustrates how the processor 14 executes a protocol declaration 30 stored in the memory 16, using the parser 40 to compile or construct a syntax tree 60 based on any bitstream definitions 102, event definitions 202, and field definitions 302, written in the declarative language. The processor 14 (FIG. 1) uses the syntax tree 60 to evaluate the physical input signal 50 and output a bitstream 70.

Figure 3:
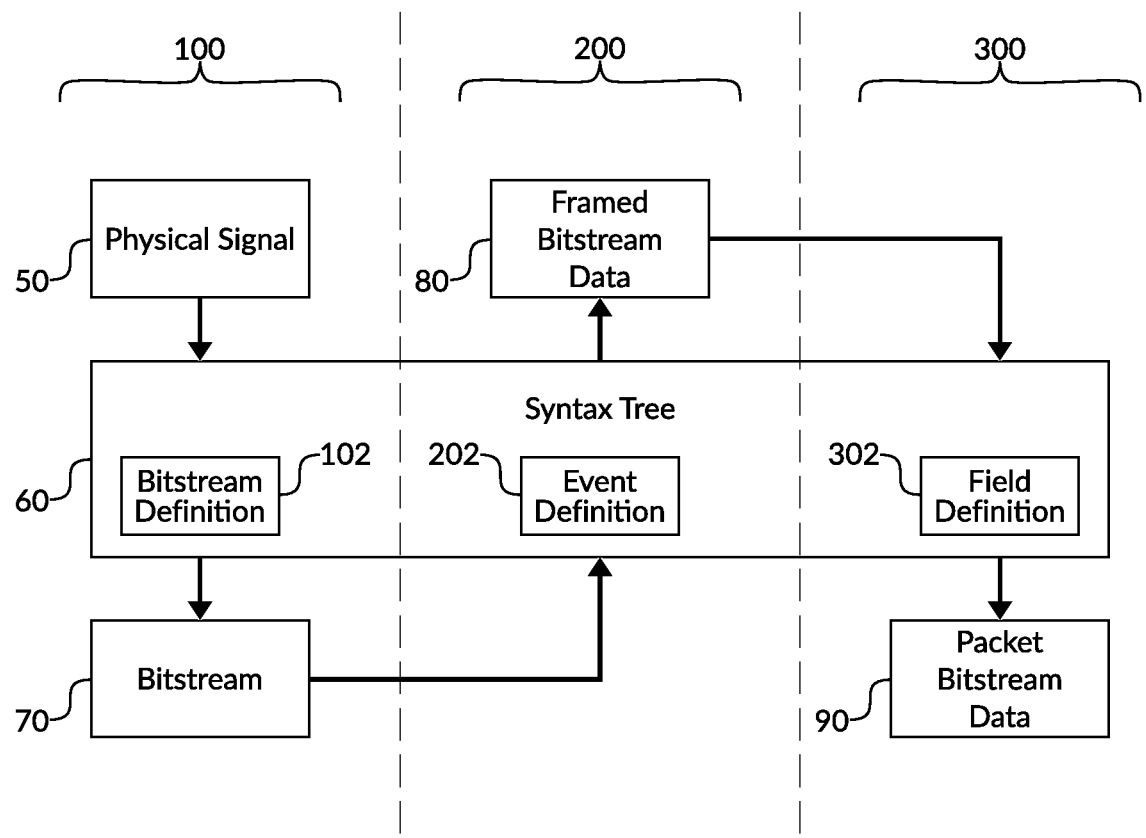
FIG. 3 is a block diagram of an example syntax tree decoding process with three stages, according to embodiments of the invention.

FIG. 3 illustrates how a protocol declaration written using the declarative language may be used by the processor 14 to decode a physical input signal 50. The process includes three primary elements that correspond to the stages of decoding with the syntax tree 60: (1) a preamble stage 100, where a preamble defines the number of physical input signals 50 and how to transform them into a raw bitstream 70 using bitstream definitions 102 in the protocol declaration 30 (FIG. 2); (2) an event finding stage 200, where rules define how to find the start and end of packet frames within the bitstream using event definitions 202 in the protocol declaration 30 to output framed bitstream data 80; and (3) a field mapping stage 300, where field structures are defined within specific packet types for generating packets 90 using field definitions 302 in the protocol declaration 30.

With references to FIGS. 2-3, in the preamble stage 100, the processor 14 and/or parser 40 compiles the syntax tree 60 and transforms the physical input signal(s) 50 into a raw bitstream 70 using the bitstream definitions 102 within the protocol declaration 30. The bitstream definitions 102 may specify standard physical layer approaches for converting analog signals into a binary bit sequence of 0s and 1s. In some embodiments, the bitstream definitions 102 may be written using custom and/or domain-specific declarative language, which may add security to the transmitted data. In other embodiments, however, the bitstream definitions 102 may be written using standard line code encoding protocols, which can be stored in a line code encoding library. The standard line code encoding protocols may be written in standard Turing complete programming language, such as C, for example.

When the processor 14 executes the syntax tree 60 during the preamble stage 100, the physical input signal 50 is prepared for packet decoding by converting the physical input signal 50 into a raw bitstream 70. The processor 14 translates the physical input signal 50 into raw bitstream representations or values using nodes of the syntax tree 60 based on the bitstream definitions 102 of the protocol declaration 30. The processor 14 may perform this bitstream conversion through direct calls to pre-defined bitstream definitions 102 within the protocol declaration 30.

During the preamble stage 100, the processor 14 may also perform in some embodiments additional calculations on the physical input data and check states of arbitrary settings for later logic-based decisions. Standard expression evaluation and variable assignment are supported in the preamble stage 100 as intermediate calculations to be used in the event detection and field mapping operations of the later stages.

In the event finding stage 200, the syntax tree 60 utilizes the event definitions 202 in the protocol declaration 30 to find the start and end bits of a packet frame within the bitstream 70 and to output framed bitstream data 80.

In the field mapping stage 300, the syntax tree 60 utilizes the field definitions 302 in the protocol declaration 30 to define each of the various fields within each frame of the framed bitstream data 80 and output packet bitstream data 90.

Figure 4:
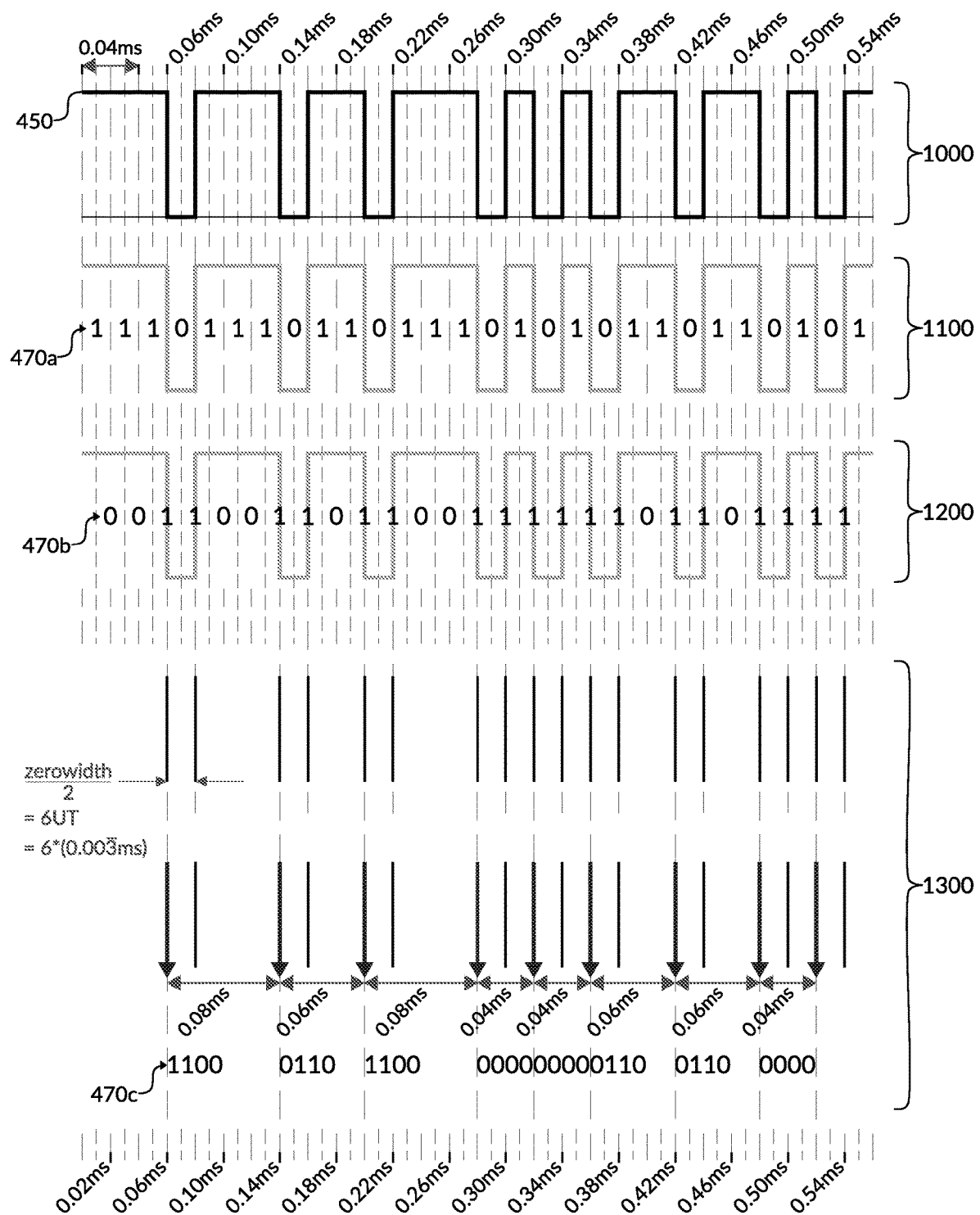
FIG. 4 is a time plot showing the conversion of a physical input signal into a raw bitstream in a first stage of an example syntax tree decoding process, using different bitstream definitions from a protocol declaration, according to embodiments of the invention.

FIG. 4 further illustrates on a time plot how, during the preamble stage 100 of FIG. 3, various bitstream definitions 102 within the protocol declaration 30 can be used to convert a physical input signal 450 into different bitstreams 470a-c. Using the specific, single physical input signal 450 in section 1000 of the time plot in FIG. 4, the processor 14 uses a bitstream definition of section 1100 to convert the physical input signal 450 into a bitstream 470a based on the line code encoding of non-return-to-zero (NRZ). Within the protocol declaration 30, the bitstream definition of section 1100 may be written as:

bitstream A=nrz(data);

where "A" represents a variable containing the results of the bitstream conversion function, "nrz( )" is a predefined function stored in memory, and "data" is a variable representing the sampled data of the physical input signal 450. As shown in FIG. 4, the physical input signal 450 of section 1000 overlays the bitstream 470a in section 1100, showing the edges aligning with the regular time intervals, at which the physical input signal 450 is evaluated based on its value under the bitstream definition of section 1100.

Similarly, in section 1200 the processor 14 outputs from the same physical input signal 450 of section 1000 a different bitstream 470b based on a bitstream definition of section 1200, which may be written as:

bitstream A=NRZM(data);

where "A" again represents the sequence of calculated bit values based on the predefined function for decoding non-return-to-zero mark encoding, NRZM( ), which as described above can be predefined and stored part of the line code encoding library, and how the function resolves for the given "data" or physical input signal 450. As shown in FIG. 4, the physical input signal 450 of section 1000 overlays the bitstream 470b in section 1200, showing the edges centered in the regular time intervals, during which the physical input signal 450 is evaluated based on whether it transitions from low to high or high to low under the bitstream definition of section 1200.

The bitstream definitions of sections 1100 and 1200 illustrate that bitstream definitions 102 may be based on standard line code encoding protocols, which can be referenced and stored in a line code encoding library, and that differing bitstream definitions 102 will result in differing bitstreams 470a-c. Alternatively, the bitstream definition 102 may be customized for a specific domain, which could add to the security of the transmitted data.

A custom bitstream definition 102 may be defined using a subset of the declarative language syntax. Using only this subset, the rules for the physical input signal 50 to bitstream 70 (i.e., physical layer to data link layer) interpretation may be defined. The custom bitstream definition 102 may be compiled into a syntax tree 60. The processor 14 then executes the syntax tree 60 on the physical input signal(s) 50 to generate a bitstream output 70. The subset of grammar used for the custom bitstream functions may include variable declarations, variable increment/decrement operators, assignment statements, static map definitions, scoped-if-clauses, and yield statements.

Section 1300's bitstream definition, which causes the processor 14 to evaluate the physical input signal 450 as bitstream 470c, is an example of such a customized bitstream definition written using the declarative language. The custom bitstream definition of section 1300 can be defined within the protocol declaration 30 itself or simply referenced within the protocol declaration 30 and stored elsewhere. For example, if referenced within the protocol declaration 30, the bitstream definition of section 1300 could be written, for example, similarly to the bitstream definitions of sections 1100 and 1200, as an equation referencing a predefined function:

bitstream A=getbits(data);

where "A" is a variable representing the converted bitstream data, "getbits( )" is any user-defined function, and "data" is the physical input signal 450 of section 1000. As another example, the user-defined custom bitstream definition of section 1300 could be defined directly within the protocol declaration 30 and based on SENT bus protocol as:

```
bitstream getbits(pin data) {
  bool isFall = false;
  double pw = 0.0; double start = 0.0; double end = 0.0; double zeroWidth = 0.0;
  double t1 = 0.0; double t2 = 0.0; double t3 = 0.0; double dataWidth = 0.0;
  double lowerWidthBound = 0.0; double upperWidthBound = 0.0;
  double UT = env.getvalue("ut", 0.000003);
  if(UT<0.000003) { UT = 0.000003; }
  if(UT>0.000010) { UT = 0.000010; }
  int bit0 = 0; int bit1 = 0; int bit2 = 0; int bit3 = 0; int nibble = 0;
  isFall = data == 0;
  start = pintime(data);
  end = pintime(data[2]);
  pw = end - start;
  zeroWidth = 12.0 * UT;
  lowerWidthBound = 11.0 * UT;
  upperWidthBound = 28.0 * UT;
  dataWidth = pw - zeroWidth;
  nibble = (int) ((dataWidth / UT) + 0.5);
  t1 = start + UT;
  t2 = t1 + UT;
  t3 = t2 + UT;
  bit0 = (nibble >> 3) & 0x1;
  bit1 = (nibble >> 2) & 0x1;
  bit2 = (nibble >> 1) & 0x1;
  bit3 = nibble & 0x1;
  if (isFall && pw > lowerWidthBound && pw < upperWidthBound) {
    yield([start, bit0], [t1, bit1], [t2, bit2], [t3,bit3]);
  }
  yield( );
}
``` where the clock times of the edges of the physical input signal 450 are found and evaluated based on the varying widths of differences between the times (i.e., "pw", "dataWidth"). As shown in FIG. 4, the edge data set includes the edges surrounding a 0 value of the physical input signal 450 (found using "isFall=data==0") that are a standard width apart (i.e., "6UT"), in accordance with the SENT protocol. The standard "zeroWidth" (i.e., 0.04 ms in FIG. 4) is subtracted from the time difference between the downward falling edges (i.e., "pw", the first of which is shown in FIG. 4 as 0.08 ms) to give the "dataWidth" value. The "dataWidth" value (e.g., 0.08 ms-0.04 ms=0.04 ms) is then evaluated in terms of "UT" as a divisor (e.g., 0.04 ms/0.003 ms=12) to give the integer "nibble" value (e.g., 12 in binary is 1100). Thus, as shown in FIG. 4, the first four bit values (i.e., "nibble") of bitstream 470c are "1100" based on the length of time between the first two downward falling edges of the physical input signal 450 of section 1000.

In other words, the runtime engine treats the custom bitstream definition of section 1300 as an iterator with a state in the data flow sequence. First, as shown in FIG. 4, a threshold/hysteresis is applied to the physical input signal 450 of section 1000 to create an abstracted set of edges. The edge definitions in the edge data set may include indications of rising/falling (e.g., "isFall=data==0") and a timestamp. The edge data set may then be iterated through the node of the abstract syntax tree 60 that is based on the custom bitstream definition of section 1300 one edge at a time. This custom bitstream definition of section 1300 may use static variable declarations (e.g., "double start=0.0", "start=pintime(data)") to maintain state and to iterate through the physical input signal 450 by evaluating recognized edges while updating values at each iteration rather than resetting to the initial declared value. The variable declarations may be automatically defined as static in a manner similar to the static keyword in the C programming language, where a variable declaration may only have a value set on the first call. Each subsequent iteration call by the processor 14 on the custom bitstream definition of section 1300 may result in the variable maintaining its previous value rather than resetting the variable declaration value. The processor 14 uses the bitstream definition 102 to evaluate assignments, variables, and expressions and then return zero or more bits for any given iterator position in the edge data set. Specifically, a yield statement (i.e., "yield( )") may allow the protocol declaration author to return zero or more bits for a given edge iteration. One or more bits may be returned using a tuple that contains a pair containing timestamp and logical bit value (e.g., "[start, bit0]", "[t1, bit1]"). During the runtime execution, a yield node of the syntax tree 60 pushes the logical bit values onto the parse context object based on the yield statement. A function node then iterates through the statements of the custom bitstream definition of section 1300 for each input edge and pops the bit values off the parse context object once the yield node returns.

Bitstream evaluation may branch based on current state conditions within the physical input signal 450 of section 1000. The declarative language used within the protocol declaration 30 may include scoped if-else clauses to support this branching. For example, the custom bitstream definition of section 1300 may include an example if clause:

```
if (isFall && pw > lowerWidthBound && pw < upperWidthBound) {
    yield([start, bit0], [t1, bit1], [t2, bit2], [t3,bit3]);
}
``` where the Boolean "isFall" and the comparisons of "pw" represent the condition branch, which if met, allows access to the inner code's yield statement.

Additionally, the declarative language may provide syntax for extracting the timestamp and edge values at the current position for each iteration through the node of the syntax tree 60 created from the custom bitstream definition of section 1300. This information may be used to calculate bit values for a given edge input. For example, the custom bitstream definition of section 1300 may include the assignments:

double UT=env.getvalue("ut", 0.000003);
isFall=data==0;
start=pintime(data);
end=pintime(data[2]);
pw=end—start;
dataWidth=pw—zeroWidth;
nibble=(int) ((dataWidth/UT)+0.5);
bit0=(nibble>>3) & 0x1;
bit1=(nibble>>2) & 0x1;
bit2=(nibble>>1) & 0x1;
bit3=nibble & 0x1;

where the timestamp and edge values are extracted based on the environment variable of "ut" and the value of the "data" signal. The distance between each falling edge (i.e., between the first and third edges found in the edge data set) may then be used to calculate the integer variable "nibble", the binary form of which is used to give the four bit values, as shown in FIG. 4. Thus, the edge values and timestamp data (e.g., "start", "t1", "bit0") are extracted and correlated with the current iteration position in the data stream.

Further, the declarative language may also provide additional syntax for extracting the timestamp and edge values at an arbitrary offset from the current iteration position. This allows for evaluating timing differences between edge positions within the physical input signal 450 of section 1000. The runtime environment enforces constraints to ensure that any offset access is limited to the actual bounds of the input edge set. Because the custom bitstream definition of section 1300 is confined within upper and lower bounds, as described below, the definition will return or yield zero bit values for areas of the physical input data stream that do not fall within the definition, rather than resulting in an error in the code. The protocol declaration author thus has the benefit of boundary safety assurances as the edge iterator does not allow for the reference of data values outside the set range. For example, the custom bitstream definition of section 1300 may include the following assignments and if-clause conditions:

```
lowerWidthBound = 11.0 * UT;
upperWidthBound = 28.0 * UT;
if (isFall && pw > lowerWidthBound && pw < upperWidthBound) {
``` where any timing difference between the edges (i.e., "pw") lower than "lowerWidthBound" or higher than "upperWidthBound" is ignored, since that offset would be beyond the bounds of the edge data set.

Thus, FIG. 4 illustrates how the declarative language may be used to write varying bitstream definitions of sections 1100-1300 for decoding the same physical input signal 450 of section 1000 into different resulting bitstreams 470a-c. As such, a test and measurement system could be easily programmed to decode any physical input signal based on the protocol declaration's express definitions and/or call to predefined functions stored in libraries. In this way, the physical input signal 50 can be translated properly into a bitstream 70 regardless of its particular network protocol using the same syntax tree 60 that will be used in subsequent event finding and field mapping stages 200 and 300 or layers, such as the data link, network, or transport layers.

Next, during the event finding stage 200 of decoding, the processor 14 uses the nodes of the syntax tree 60 to scan the input data, which can be either the bitstream output 70 of the preamble stage 100 or the raw physical input signal(s) 50, to find the start and end events for a given packet type or protocol based on the event definitions within the protocol declaration 30. In particular, the event definitions 202 of the protocol declaration 30 may specify the detection of packet framing boundaries by evaluating analog, edge, or bit state using values, patterns, qualifiers and duration specifications. These start and end events are time markers that gate or indicate a packet frame within the physical input signal(s) 50 and/or bitstream 70. Any framing time markers found are passed on to the field mapping stage 300.

Figure 5:
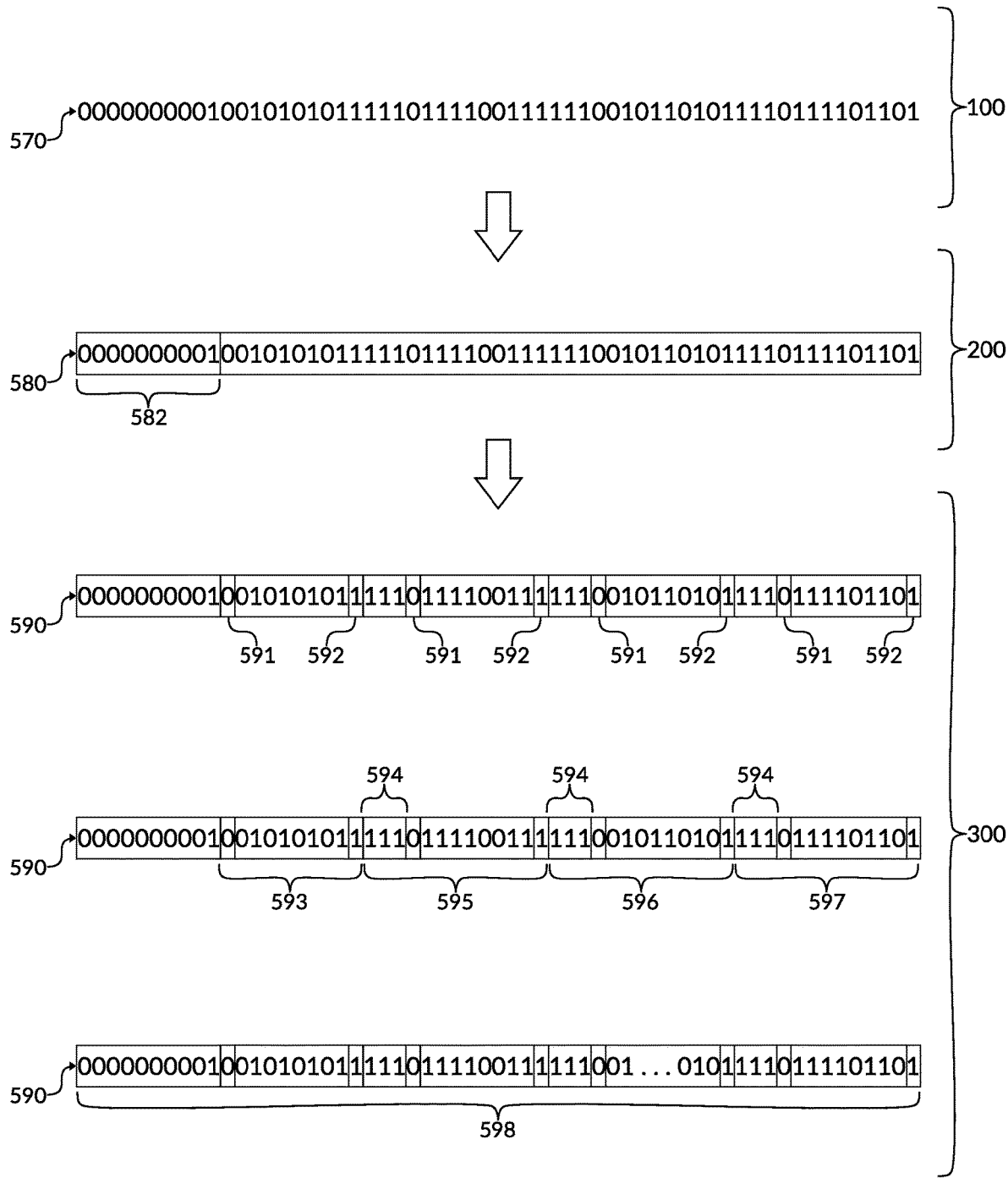
FIG. 5 is a diagram of an example syntax tree decoding process, where a protocol declaration based on the LIN protocol is used to extract packet framing and field data during event finding and field mapping stages, according to embodiments of the invention.

FIG. 5 illustrates the decoding stages of the syntax tree 60 execution according to a protocol declaration 30 written based on the LIN protocol. During the preamble stage 100, the processor 14 may execute the syntax tree 60 on the physical input signal 50 according to the protocol declaration 30, written in part as:

```
{Settings: polarity<"normal">("normal", "invert") }
decoder LIN(pin data) {
int dominant = 0; int recessive = 1;
bool invert = env.checkValue("polarity", "invert");
bitstream A = invert ? ~nrz(data) : nrz(data);
``` where the "Settings" may indicate on the user interface possible settings that may be required for the protocol, passing back any user selections to the runtime engine, and the bitstream definition for "A", using the "nrz( )" function, results in the bitstream 570. Since "normal", and not "invert", was selected in the settings for "polarity", the Boolean variable created and called "invert" becomes false, and the bitstream "A" is not inverted using the "~" bitwise complement operator.

After the preamble stage 100, the bitstream 570 is passed on to the next stage 200 of event finding, where the start and end framing time markers are evaluated by the processor 14 based on the event definitions 202 within the protocol declaration 30. For example, an event definition for event 582 could be defined within the protocol declaration 30 as:
    event SynchBreak=(A:10==0000000001b);
where the processor 14 looks for ten bits within bitstream "A" 570 that form a sequence of nine 0s followed by a 1. The event definition for event 582 includes an example of a matching rule ("A:10==0000000001b") that may be used as part of the declarative language of the protocol declaration 30 with value, pattern, mask-match, and regular expression definitions. Additionally, event time inclusion/exclusion tokens within the protocol declaration 30 written in the declarative language may provide the user with flexibility to specify whether, during packet field evaluations, the processor 14 should include data bits concurrent with the end time marker of the start-of-packet event, such as, for example:
    packet DataPacket=Start
    packet DataPacket=(Start]
where the "=Start" form means to include the end time, and the "=(Start]" form means to exclude the end time. With reference to FIG. 5, event 582 signals the start of a packet frame 580 within the bitstream "A" 570. Following these ten bits that represent event 582, the processor 14 will follow the syntax tree 60 into the field mapping stage 300 to scour the packet frame data 580 for binary sequences matching the field definitions 302 defined within the protocol declaration 30.

Specifically, in the field mapping stage 300, the processor 14 maps bitstream values into a potential packet at a framed position or packet frame determined from the event finding stage 200. Additionally, the processor 14 maps relevant fields within the frame, as defined in the field definitions 302 of the protocol declaration 30 for the particular protocol. The processor 14 achieves this field mapping by comparing a set of qualified pattern matches against the converted input data bits of the bitstream 580. These pattern matches may be simple bit field comparisons and/or complex comparisons using regular expressions. The processor 14 then uses these qualified field matches to evaluate the gated or framed region of the bitstream 590 to determine which of the declared packet types match the structure of the input data.

The field definitions 302 may include the same rule matching features as in the event definitions 202, described above. To increase flexibility in packet organization and representation, field definitions 302 may be further defined with several patterns and properties. The field definitions for fields 591 and 592 of FIG. 5 could be defined within the protocol declaration 30 as:
    field StartBit={(A:1)==dominant};
    field StopBit={(A:1)==recessive};
where the start of an eight-bit byte is flagged with a preceding bit with a bit value of 0, and the end of the byte is flagged by a following bit with a bit value of 1.

Fields may be arbitrarily recombined into new "virtual" fields for better logical representation. The field definition for field 593 of FIG. 5 could be defined within the protocol declaration 30 as:

```
field SynchFields = { StartBit, A.Synch:8.verify(_value,
    "Invalid synch field", 0x55), StopBit };
``` where field 593 is made up of ten bits, starting with the one-bit field 591, followed by an eight-bit "Synch" field with the bit sequence 01010101, and ending with the one-bit field 592. The field definition for field 593 illustrates how field definitions 302 can include other fields nested within the defined field.

The field definition for field 594 of FIG. 5 could be defined within the protocol declaration 30 as:
    field InterFrameSpace={{(A:1)==recessive} {0, 15} };
where field 594 could have a length of zero to fifteen bits based on the repetition of a true result of the relational operator "==". In addition to and contrast with the field matching rules, the field definitions 302 may include field quantifier rules that allow for fixed or arbitrary length field repetition. The field definition for field 594 includes an example of a field quantifier "{0, 15}" where "0" is the minimum field length, and "15" is the maximum field length for the fixed field 594. Fixed field quantifiers are in the form (1) "{n}", where the preceding element must match exactly n times, (2) "{n, m}", where the preceding element must match at least n times but no more than m times, or (3) "?", where the preceding element must match just once, or not match. Fields may also be defined with an arbitrary bit width and/or length, which could use the form (1) "*", where the preceding element must match zero or more times, (2) "+", where the preceding element must match one or more times, or (3) "{n,}", where the preceding element must match at least n times.

The field definition for field 595 of FIG. 5 could be defined within the protocol declaration 30 as:

```
field IdFields = { InterFrameSpace, StartBit, A.ID0#EXCLUDE:1,
    A.ID1#EXCLUDE:1,
    A.ID2#EXCLUDE:1, A.ID3#EXCLUDE:1, A.ID4#EXCLUDE:1,
    A.ID5#EXCLUDE:1,
    A.P0#EXCLUDE:1.verify(_parity, even, ID0, ID1, ID2, ID4),
    A.P1#EXCLUDE:1.verify(_parity, odd, ID1, ID3, ID4, ID5), StopBit,
    Identifier {ID0, ID1, ID2, ID3, ID4, ID5, P0, P1} };
``` where the field 595 begins with the zero-to-fifteen-bit field 594, followed by the one-bit field 591, then an eight-bit "Identifier" field, and ends with the one-bit field 592. The field definition for field 595 includes an example of a field property used in each of the one-bit fields of the "Identifier"

field, where the "#EXCLUDE" token allows for post-processing of the results during runtime evaluation. Further variations of a "#" token are possible for any property desired to be tagged or attached onto a field during field mapping for additional post-processing steps. Additionally, the field definition for the "Identifier" field within the field definition for field 595 is an example of field nesting. Field nesting and grouping allow nested structures with distinct quantifier rules at each level. Finally, fields "P0" and "P1" in the above field definition include data verification, where four fields within the "Identifier" field are compared and checked against each of the "P0" and "P1" fields for even or odd parity.

The domain-specific declarative language allows the protocol declaration 30 to include field definitions 302 with action and property parameters, such as the "#EXCLUDE" token described above. The processor 14 evaluates these action and property parameters during the syntax tree 60 execution. The action parameters may be predefined tokens that are recognizable to the parser 40. The action parameters can be used by the processor 14 to modify the characteristics of bitstream evaluation and/or perform any other arbitrary computation upon a successful field match. Field action parameters within the field definitions 302 enable arbitrary runtime state machine changes based on field match conditions, such as, for example:

(A.DTS2:1)==HIGH <ENABLE_STROBE_SYNC>, where "<ENABLE_STROBE_SYNC>" is an example action parameter. In contrast with the field action parameter, the property parameter may be a token that sets any arbitrary property against the field. The property parameter tokens may be used by the processor 14 for pre- and post-processing of the field results. Field property parameters establish arbitrary runtime evaluation rules for a given field definition, such as the "#EXCLUDE" token described above.

The field definition for field 596 of FIG. 5 could be defined within the protocol declaration 30 as:

field DataFields={InterFrameSpace, StartBit, A.Data:8, StopBit};

where field 596 begins with the zero-to-fifteen-bit field 594, followed by the one-bit field 591, then an eight-bit "Data" field, and ends with the one-bit field 592.

The field definition for field 597 of FIG. 5 could be defined within the protocol declaration 30 as:

```
field ClassicCheckSumFields = { InterFrameSpace, StartBit,
    A.Checksum:8.verify(_checksum, CARRYON, Data), StopBit };
``` where field 597 begins with the zero-to-fifteen-bit field 594, followed by the one-bit field 591, then an eight-bit "Checksum" field, and ends with the one-bit field 592. The field definition for field 597 includes another example of data verification using "_checksum" to evaluate whether the field is a "Data" field or the proper checksum summation of the previous eight-bit "Data" fields.

Fields definitions 302 in the protocol declaration 30 may include user-defined error handling and/or flagging. This error handling allows the protocol declaration author to verify the results of cyclic redundancy checks (CRCs), checksums, parities and/or values. This verification process enables error conditions to be shown to an end user for viewing and/or debugging protocol captures. Arbitrary CRC polynomial definitions within the field definitions 302 enable CRC error checking, such as, for example:

_crc HeaderPoly=x^11+x^9+x^8+x^7+x^2+1, 0x01A, 0;

Error and CRC field sequence definitions enable parity, checksum, CRC, and other data verification calculations against disjoint packet regions (e.g., "verify(parity, even, ID0, ID1, ID2, ID4)"). Further verification field definitions are possible, such as user-defined strings with variable substitution allowing error messages written by the protocol declaration author to attach to the decoded field results. The user interface may display runtime/decoding error messages detected by the runtime engine.

The packet field definition for field 598 of FIG. 5 could be defined within the protocol declaration 30 as:

```
packet MASTER_REQUEST_FRAME = SynchBreak { LSB
    { SynchFields, IdFields, {ID0, ID1, ID2, ID3, ID4, ID5} ==
    0X3C, {DataFields} {8}, ClassicCheckSumFields } };
``` where the variable-length packet field 598 begins (and includes data concurrent) with the start-of-packet event 582, followed by field 593, then field 595, followed by field 596 (where the field pattern 596 must occur eight times according to the field quantifier "{8}"), and ends with field 597. The packet field definition for field 598 illustrates how fields may be grouped together with regular expression-style repeat flags for recurring field patterns. Specifically, for the packet field definition for field 598, the "Identifier" field within field 595 must begin with the bit sequence 111100. This requirement is indicated by the field matching rule "{ID0, ID1, ID2, ID3, ID4, ID5}==0X3C". Also within the packet field definition for field 598 is an example of a specified evaluation (here, "LSB") for a region of the packet field 598. Regions and/or scoped regions within field definitions 302 for packet types may specify to the processor 14 a type of evaluation to use, such as bit-stuff rules, least significant bit (LSB), most significant bit (MSB), big-endian, and/or little-endian, for example.

Arbitrary bit-stuff rule definitions may be included in the field definitions 302, such as, for example:

```
bitstuff stuffComplement = (0b, 5) | (1b, 5);
field RemoteFrameFields = {
    stuffComplement {
        { RTR } == recessive,
        A.CRC:15.verify(_crc, CAN_P, Identifier-DataLengthCode,
        SOF<-0) } };
``` where the bit-stuff definition "stuffComplement" prevents the processor 14 from misreading certain flags, markers, and/or other fields into data and/or other fields in the bitstream, as is known in the art. Using the declarative language of the present disclosure, the protocol declaration author may write customized and domain-specific bit-stuff rules suited to the particular application. Protocol declarations 30 may include calls to common bit-stuff rules stored in a library in memory 16 or in other storage media.

Additionally, as described above for bitstream definitions 102, the field definitions 302 and event definitions 202 may include scoped if clauses that enable branching logic for field definitions based on the evaluation of Boolean expressions.

Figure 6:
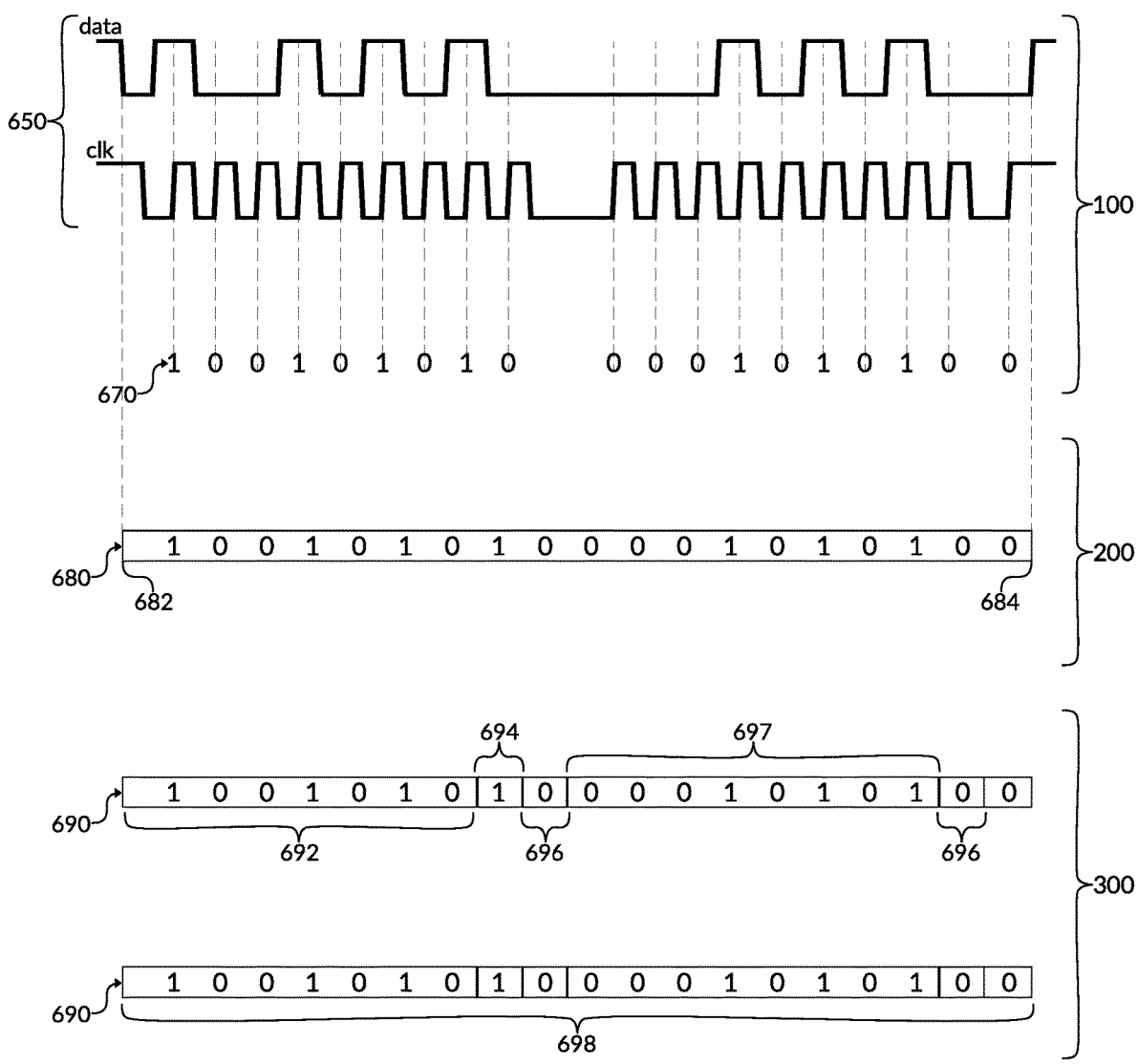
FIG. 6 is a diagram of an example syntax tree decoding process, where a protocol declaration based on the I2C protocol is used to convert multiple physical input signals into framed packet bitstream data, according to embodiments of the invention.

In some embodiments, more than one physical input signal 50 may be received. For example, a clock signal may be received along with a data signal. FIG. 6 illustrates the three decoding stages of the syntax tree 60, using two different physical input signals 650 with a protocol declaration 30 based on the I2C protocol. During the preamble stage 100, the processor 14 may execute the syntax tree 60 on the two physical input signals 650 according to the protocol declaration 30, which may be written in part as:

```
decoder I2C(PIN clk, PIN data) {
    bitstream A = clock(data) @ rise(clk);
``` where the "PIN clk" and "PIN data" represent the two different physical input signals 650, and the bitstream 670 is created by determining a bit value based on the data ("data") signal every time the clock ("clk") signal goes from low to high.

During the event finding stage 200, the start and end times and/or locations for a packet frame are found based on the event definitions 202 in the protocol declaration 30. The event definitions for events 682 and 684 of FIG. 6 could be written in the protocol declaration 30 as:

event S=fall(data) when clk==1;
  event P=rise(data) when clk==1;

where event 682 occurs every time the data signal goes from high to low while the clock signal is high, and event 684 occurs every time the data signal goes from low to high while the clock signal is high. The event definitions for events 682 and 684 illustrate an example of the event finding stage 200 using raw analog physical input signals, rather than a binary bitstream output from the preamble stage 100, to find the packet framing boundaries within the bitstream 670.

Complex events can also be evaluated by the processor 14 during the event finding stage 200. Complex event definitions may allow the combined evaluation of an arbitrary number of simpler events, which can be evaluated using a logical "OR" combination and/or as a sequence of events with an optional duration specification. For example, complex event definitions for complex events may be written in the declarative language within the protocol declaration 30 as:

cevent SR=peek S;
  cevent SRP=(P|SR);

where the complex event "SR" occurs anytime the event "S" is found added to the stack according to the "peek" operation, and the complex event "SRP" occurs anytime the syntax tree 60 encounters either (1) the event "P", defined according to event definition for event 684 above, or (2) the complex event "SR".

The fields 692, 694, 696, and 697 of FIG. 6 may all be defined in a packet field definition for field 698 written in the protocol declaration 30 as:

```
int WRITE = 0; int READ = 1;
packet Read7 = S {
A.Address:7, (A.RW:1)==READ, A.Ack:1, (A.Data:8, A.Ack:1)+ } SRP;
``` where the packet field 698 begins with the zero-bit event 682, followed by a seven-bit "Address" field 692 and a one-bit "RW" field 694 (where the bit value is 1), then a one-bit "Ack" field 696, preceding at least one grouping of an eight-bit "Data" field 697 followed by the one-bit "Ack" field 696, and ends with the complex event "SRP".

Figure 7:
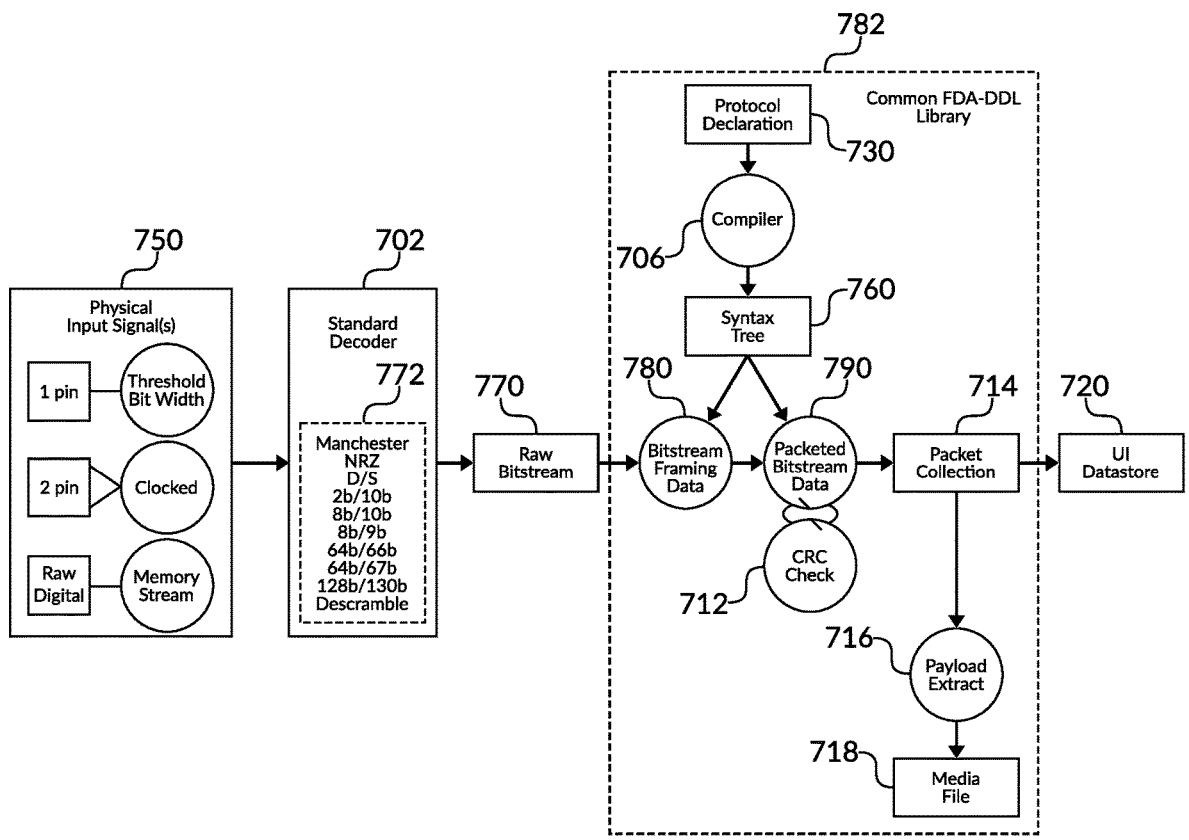
FIG. 7 is a block diagram of an example processing and data flow, according to embodiments of the invention.

FIG. 7 shows a block diagram of an example processing and data flow of the generalized syntax tree execution, according to some embodiments of the disclosure. The syntax tree may be used to auto-generate a protocol-specific state machine. This protocol-specific state machine may be used by the processor 14 to perform runtime evaluations of input data. The parser 40 reads the protocol declaration 730 from the memory 16 and a compiler 706 within the parser 40 or the processor 14 compiles the syntax tree 60.

The physical input signals 750 are decoded using commonly known physical line code encoding or custom bitstream definitions based on the protocol declaration 30. Rather than or in addition to writing custom bitstream definitions, as described above, the standard decoder 702 may use commonly known physical layer line coding or encoding schemes to transform the physical input signal 750 into a raw bitstream 770, as illustrated in FIG. 7. Commonly known physical layer line coding or encoding schemes may include, for example, Manchester, return-to-zero, non-return-to-zero (NRZ), non-return-to-zero mark (NRZ-M), data strobe (D/S), 2b/10b, 8b/10b, 8b/9b, 64b/66b, 64b/67b, 128b/130b, and descramble. These commonly known physical layer line coding and encoding schemes may be included in a line code encoding library 772 and used for decoder support. The bitstream definitions may be written as static C++ co-routines that are called directly by the decoder runtime engine on which the syntax tree executes. Under this approach, the runtime, grammar, and lex tokens are updated every time a new physical layer bitstream definition is encountered. This updating process may be used in any language-based protocol approach that focuses on the analysis and mapping of bitstream sequences into protocol specific information flows.

The processor 14 then executes the syntax tree 760 to convert the raw bitstream 770 from the standard decoder 702 into bitstream framing data 780 using frame and/or event definitions 202. The syntax tree 760 then further matches the field definitions 302 to output packeted bitstream data 790. A CRC check 712, discussed in detail above, may also be performed.

The bitstream 770 may be evaluated using a field device access (FDA) and device description language (DDL) library 782 to convert the source input data into an output media file using token replacement according to the protocol declaration 30. The frames and packets of the decoded bitstream are collected 714 and the payload is extracted 716 from the packets to determine the media file 718. The packet collection 714 may also be saved within a datastore 720.

Although various example definitions have been provided above for explanation, embodiments of the disclosure are not limited to such definitions, and a wide array of definitions may be written by the protocol declaration author using the declarative language.

The aspects of the present disclosure are susceptible to various modifications and alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific aspects described herein unless expressly limited. As such, the present disclosure is intended to cover all modifications, equivalents, and alternatives of the described aspects in light of the attached drawings and claims.

The physical layer analog signaling may be converted into a bitstream by custom hardware chipsets, field-programmable gate arrays (FPGAs), and/or other general-purpose language algorithms.

References in the specification to aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

Aspects of the disclosure may operate on a particularly created hardware, on firmware, digital signal processors, or on a specially programmed computer including a processor operating according to programmed instructions, such as a computing device adapted for test and measurement, for example. A computing device adapted for test and measurement may encompass a test and measurement system. Input data may be delivered from a direct physical channel input. Additionally or alternatively, the input data may be delivered from a file and/or memory-based input of a previously sampled and/or synthesized line-coded physical signal input. Some of the disclosed systems may operate using cloud-enabled server technology. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer-readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data may be referred to as a computer program product. Computer-readable media, as discussed described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Although specific aspects of the disclosure have been illustrated and described for purposes of illustration, it will be understood that various modifications may be made without departing from the spirit and scope of the disclosure. Accordingly, the disclosure should not be limited except as by the appended claims.

EXAMPLES

Illustrative examples of the technologies disclosed herein are provided below. An embodiment of the technologies may include any one or more, and any combination of, the examples described below.

Example 1 includes a computing device adapted for test and measurement, comprising: a physical channel input for receiving a line coded physical signal; a memory for storing a syntax tree generated from declarative language definitions; and a processor operatively coupled to the memory and configured to: access the syntax tree, extract time and edge data from the line coded physical signal using the syntax tree, and generate bit values for a bitstream using the extracted time and edge data based on a state of the syntax tree.

Example 2 includes aspects of example 1, wherein the processor is further configured to: extract time markers from the bitstream based on event start and end definitions within the declarative language definitions; and generate packet frames for the bitstream using the syntax tree based on the extracted time markers.

Example 3 includes aspects of examples 1 and 2, wherein the processor is further configured to: map fields within the generated packet frames based on field definitions within the declarative language definitions; and generate packets for the bitstream using the syntax tree based on the mapped fields.

Example 4 includes aspects of examples 1, 2, and 3, wherein the processor is further configured to: verify packets using the syntax tree based on error handling definitions.

Example 5 includes aspects of examples 1 and 2, wherein the event start and end definitions are obtained from a field device access and device description language library.

Example 6 includes aspects of example 1, wherein the declarative language definitions are obtained from a line code encoding library.

Example 7 includes aspects of example 1, wherein the processor is further configured to compile the syntax tree from the declarative language definitions.

Example 8 includes aspects of example 1, wherein the syntax tree is stored in a first memory and the declarative language definitions are stored in a second memory.

Example 9 includes a method for interpreting a physical input signal using a syntax tree, the method comprising: reading declarative language definitions; compiling the syntax tree based on the declarative language definitions; and converting the physical input signal into a bitstream by employing nodes of the syntax tree to decode a line code encoding of the physical input signal.

Example 10 includes aspects of example 9, further comprising: generating packet frames for the bitstream using the syntax tree based on event start and end definitions.

Example 11 includes aspects of examples 9 and 10, further comprising: generating packets for the bitstream using the syntax tree based on field definitions.

Example 12 includes aspects of examples 9, 10, and 11, further comprising: verifying packets using the syntax tree based on error handling definitions.

Example 13 includes aspects of examples 9, 10, and 11, further comprising: extracting a payload from the packets of the bitstream using token replacement to output a media file.

Example 14 includes aspects of examples 9 and 10, wherein the event start and end definitions are from a field device access and device description language library.

Example 15 includes aspects of example 9, wherein the declarative language definitions are from a line code encoding library.

Example 16 includes a computer program product stored in a medium that, when executed by a processor in a computing device adapted for test and measurement, causes the computing device to: compile a syntax tree based on a protocol declaration that includes one or more of bitstream definitions, event definitions, and field definitions; receive a physical signal; and decode the physical signal into a bitstream using the syntax tree.

Example 17 includes aspects of example 16 that further causes the computing device to: use a line code encoding library to supply the bitstream definitions.

Example 18 includes aspects of example 16 that further causes the computing device to: use a field device access and device description language library to supply the event definitions.

Example 19 includes aspects of example 16 that further causes the computing device to: use a field device access and device description language library to supply the field definitions.

Example 20 includes aspects of example 16, wherein the protocol declaration is based on a standard network protocol.

Example 21 includes aspects of example 16, wherein the protocol declaration is based on a custom network protocol.

Example 22 includes aspects of example 16 that further causes the computing device to: extract a payload from the bitstream using token replacement to output a media file.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Although specific aspects of the invention have been illustrated and described for purposes of illustration, it will be understood that various modifications may be made without departing from the spirit and scope of the invention. Accordingly, the invention should not be limited except as by the appended claims.

What is claimed is:

1. A computing device adapted for test and measurement, comprising:
    a physical channel input for receiving a line-coded physical signal;
    a memory for storing a syntax tree generated from declarative language definitions; and
    a processor operatively coupled to the memory and configured to:
        access the syntax tree,
        extract time and edge data from the line-coded physical signal using the syntax tree, and
        generate bit values for a bitstream using the extracted time and edge data based on a state of the syntax tree.

2. The computing device of claim 1, wherein the processor is further configured to:
    extract time markers from the bitstream based on event start and end definitions within the declarative language definitions; and
    generate packet frames for the bitstream using the syntax tree based on the extracted time markers.

3. The computing device of claim 2, wherein the processor is further configured to:
    map fields within the generated packet frames based on field definitions within the declarative language definitions; and
    generate packets for the bitstream using the syntax tree based on the mapped fields.

4. The computing device of claim 3, wherein the processor is further configured to:
    verify packets using the syntax tree based on error handling definitions.

5. The computing device of claim 2, wherein the event start and end definitions are obtained from a field device access and device description language library.

6. The computing device of claim 1, wherein the declarative language definitions are obtained from a line code encoding library.

7. The computing device of claim 1, wherein the processor is further configured to compile the syntax tree from the declarative language definitions.

8. The computing device of claim 1, wherein the syntax tree is stored in a first memory and the declarative language definitions are stored in a second memory.

9. A method for interpreting a physical input signal using a syntax tree, the method comprising:
    reading declarative language definitions;
    compiling the syntax tree based on the declarative language definitions; and
    converting the physical input signal into a bitstream by employing nodes of the syntax tree to decode a line code encoding of the physical input signal.

10. The method of claim 9, further comprising:
    generating packet frames for the bitstream using the syntax tree based on event start and end definitions.

11. The method of claim 10, further comprising:
generating packets for the bitstream using the syntax tree based on field definitions.

12. The method of claim 11, further comprising:
verifying packets using the syntax tree based on error handling definitions.

13. The method of claim 11, further comprising:
extracting a payload from the packets of the bitstream using token replacement to output a media file.

14. The method of claim 10, wherein the event start and end definitions are from a field device access and device description language library.

15. The method of claim 9, wherein the declarative language definitions are from a line code encoding library.

16. A computer program product stored in a non-transitory medium that, when executed by a processor in a computing device adapted for test and measurement, causes the computing device to:
compile a syntax tree based on a protocol declaration that includes one or more of bitstream definitions, event definitions, and field definitions;
receive a physical signal; and
decode the physical signal into a bitstream using the syntax tree.

17. The computer program product of claim 16 that further causes the computing device to:
use a line code encoding library to supply the bitstream definitions.

18. The computer program product of claim 16 that further causes the computing device to:
use a field device access and device description language library to supply the event definitions.

19. The computer program product of claim 16 that further causes the computing device to:
use a field device access and device description language library to supply the field definitions.

20. The computer program product of claim 16, wherein the protocol declaration is based on a standard network protocol.

21. The computer program product of claim 16, wherein the protocol declaration is based on a custom network protocol.

22. The computer program product of claim 16 that further causes the computing device to:
extract a payload from the bitstream using token replacement to output a media file.

* * * * *